(12) United States Patent
Biskeborn et al.

(10) Patent No.: US 8,879,209 B2
(45) Date of Patent: Nov. 4, 2014

(54) DEVICE SELECT SYSTEM FOR MULTI-DEVICE ELECTRONIC SYSTEM

(71) Applicant: International Business Machines Corporation, Armonk, NY (US)

(72) Inventors: Robert G. Biskeborn, Hollister, CA (US); Larry L. Tretter, Tucson, AZ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/050,267

(22) Filed: Oct. 9, 2013

(65) Prior Publication Data

US 2014/0036393 A1 Feb. 6, 2014

Related U.S. Application Data

(63) Continuation of application No. 12/191,226, filed on Aug. 13, 2008, now Pat. No. 8,587,902, which is a continuation-in-part of application No. 11/734,634, filed on Apr. 12, 2007.

(51) Int. Cl.

| | |
|---|---|
| *G11B 5/48* | (2006.01) |
| *G11B 21/16* | (2006.01) |
| *G11B 5/55* | (2006.01) |
| *G11B 21/08* | (2006.01) |
| *H03K 17/56* | (2006.01) |
| *G11B 15/087* | (2006.01) |
| *H03K 17/00* | (2006.01) |
| *G11B 15/60* | (2006.01) |
| *G11B 5/17* | (2006.01) |
| *G11B 5/265* | (2006.01) |
| *G11B 15/06* | (2006.01) |
| *G11B 15/18* | (2006.01) |
| *G11B 15/467* | (2006.01) |

(52) U.S. Cl.
CPC . *G11B 5/17* (2013.01); *G11B 15/06* (2013.01); *H03K 17/56* (2013.01); *G11B 15/1825* (2013.01); *G11B 15/087* (2013.01); *H03K 17/002* (2013.01); *G11B 15/602* (2013.01); *G11B 15/467* (2013.01)
USPC ............... 360/241.1; 360/121; 360/261.1

(58) Field of Classification Search
None
See application file for complete search history.

(56) References Cited

U.S. PATENT DOCUMENTS

| | | |
|---|---|---|
| 3,764,986 A | 10/1973 | Spademan et al. |
| 4,472,750 A | 9/1984 | Klumpp et al. |

(Continued)

FOREIGN PATENT DOCUMENTS

| | | |
|---|---|---|
| EP | 0468113 | 1/1992 |
| JP | 2001184148 | 7/2001 |
| WO | WO2004027566 | 4/2004 |

OTHER PUBLICATIONS

Non-Final Office Action from U.S. Appl. No. 11/734,634 dated Apr. 6, 2010.

(Continued)

*Primary Examiner* — Daniell L Negron

(74) *Attorney, Agent, or Firm* — Zilka-Kotab, PC

(57) ABSTRACT

In one general embodiment, a system includes a first device on a first substrate; a second device on a second substrate; and a device select system coupled to the first and second devices. The device select system includes: a first portion having an array of first electrical contacts; a second portion having an array of second electrical contacts, there being more second electrical contacts than first electrical contacts, the second portion being coupled to the first and second devices, each of the first electrical contacts being associated with at least two of the second electrical contacts; and a select mechanism for selectively placing each of the first electrical contacts in electrical communication with one of the second electrical contacts associated therewith.

15 Claims, 18 Drawing Sheets

(56) References Cited

U.S. PATENT DOCUMENTS

| | | | |
|---|---|---|---|
| 4,520,413 A | 5/1985 | Piotrowski et al. | |
| 5,065,267 A | 11/1991 | Yohda | |
| 5,287,478 A | 2/1994 | Johnston et al. | |
| 5,289,330 A * | 2/1994 | Wade | 360/122 |
| 5,646,806 A | 7/1997 | Griffith et al. | |
| 5,679,942 A | 10/1997 | Toyama | |
| 5,862,014 A * | 1/1999 | Nute | 360/291 |
| 5,875,065 A | 2/1999 | Shimura | |
| 5,907,655 A | 5/1999 | Oguro | |
| 6,088,183 A | 7/2000 | Nelson | |
| 6,341,416 B1 | 1/2002 | Biskeborn et al. | |
| 6,388,830 B1 | 5/2002 | Matousek et al. | |
| 6,404,594 B1 | 6/2002 | Maruyama et al. | |
| 6,529,348 B2 | 3/2003 | Maruyama et al. | |
| 6,826,140 B2 | 11/2004 | Brommer et al. | |
| 7,012,775 B2 | 3/2006 | Suzuki et al. | |
| 8,587,902 B2 * | 11/2013 | Biskeborn et al. | 360/241.1 |
| 2005/0082407 A1 | 4/2005 | Saliba et al. | |
| 2005/0134789 A1 | 6/2005 | Yoo et al. | |
| 2005/0134989 A1 | 6/2005 | Girvin et al. | |
| 2005/0135017 A1 | 6/2005 | Biskeborn | |
| 2005/0259353 A1 | 11/2005 | Magnusson | |
| 2006/0028753 A1 | 2/2006 | Al-Azzawi | |
| 2008/0252357 A1 | 10/2008 | Biskeborn et al. | |
| 2008/0291566 A1 | 11/2008 | Biskeborn et al. | |

OTHER PUBLICATIONS

Non-Final Office Action from U.S. Appl. No. 11/734,634 dated Jul. 13, 2010.

Non-Final Office Action from U.S. Appl. No. 11/734,634 dated Dec. 2, 2010.

Final Office Action from U.S. Appl. No. 11/734,634 dated Apr. 29, 2011.

Non-Final Office Action from U.S. Appl. No. 12/191,226 dated Mar. 6, 2012.

Final Office Action from U.S. Appl. No. 12/191,226 dated Sep. 10, 2012.

Non-Final Office Action from U.S. Appl. No. 12/191,226 dated Dec. 28, 2012.

Final Office Action from U.S. Appl. No. 12/191,226 dated May 17, 2013.

Notice of Allowance and Fee(s) Due from U.S. Appl. No. 12/191,226 dated Jul. 12, 2013.

* cited by examiner

DEVICE SELECT SYSTEM FOR MULTI-DEVICE ELECTRONIC SYSTEM

RELATED APPLICATIONS

This application is a continuation of U.S. patent application Ser. No. 12/191,226, filed Aug. 13, 2008, which is a continuation in part of U.S. patent application Ser. No. 11/734,634, filed Apr. 12, 2007, from which priority is claimed and which are herein incorporated by reference.

BACKGROUND

The present invention relates to device select systems, and more particularly, this invention relates to a device select system and methods for selecting devices on multiple magnetic heads.

Business, science and entertainment applications depend upon computers to process and record data, often with large volumes of the data being stored or transferred to nonvolatile storage media, such as magnetic discs, magnetic tape cartridges, optical disk cartridges, floppy diskettes, or floptical diskettes. Typically, magnetic tape is the most economical means of storing or archiving the data. Storage technology is continually pushed to increase storage capacity and storage reliability. Improvement in data storage densities in magnetic storage media, for example, has resulted from improved medium materials, improved error correction techniques and decreased areal bit sizes. The data capacity of half-inch magnetic tape, for example, is now measured in hundreds of gigabytes on 512 or more data tracks.

The improvement in magnetic medium data storage capacity arises in large part from improvements in the magnetic head assembly used for reading and writing data on the magnetic storage medium. A major improvement in transducer technology arrived with the magnetoresistive (MR) sensor originally developed by the IBM® Corporation. Later sensors using the GMR effect were developed. AMR and GMR sensors transduce magnetic field changes to resistance changes, which are processed to provide digital signals. Data storage density can be increased because AMR and GMR sensors offer signal levels higher than those available from conventional inductive read heads for a given read sensor width and so enable smaller reader widths and thus more tracks per inch. Moreover, the sensor output signal depends only on the instantaneous magnetic field intensity in the storage medium and is independent of the magnetic field time-rate-of-change arising from relative sensor/medium velocity. In operation the magnetic storage medium, such as tape or a magnetic disk surface, is passed over the magnetic read/write (RIM head assembly for reading data therefrom and writing data thereto.

However, increased storage capacity does not come without cost. For instance, as the number of R/W elements on a given head increases, so too must the number of electrical connections to the head. This means that the cable(s) connecting the head to the controller must accommodate the increased number of connections. One problem that arises is that cables tend to get more complex and costly as the number of devices in the head, and therefore the number of leads in the cable, increases. Further, cables tend to net wider, and thus stiffer and more massive as the number of leads increases, which in turn can negatively affect actuator bandwidth and make cable routing for freedom of motion more difficult. Generally, shrinking the dimensions of the leads in the cable is not an option, as DC resistance and AC impedance would also change undesirably.

Current technology fails to address tape head cabling problems that will be posed by bourgeoning I/O needs for future multi-track, multi-format or multi-function tape heads.

BRIEF SUMMARY

In one general embodiment, a system includes a first device on a first substrate; a second device on a second substrate; and a device select system coupled to the first and second devices. The device select system includes: a first portion having an array of first electrical contacts; a second portion having an array of second electrical contacts, there being more second electrical contacts than first electrical contacts, the second portion being coupled to the first and second devices, each of the first electrical contacts being associated with at least two of the second electrical contacts; and a select mechanism for selectively placing each of the first electrical contacts in electrical communication with one of the second electrical contacts associated therewith.

In another general embodiment, a data storage system includes a first array of transducers on a first substrate; a second array of transducers on a second substrate; a device select system in electrical communication with the first and second arrays; a cable electrically coupled to the first portion of the device select system; a drive mechanism for passing a magnetic recording medium over the head; and a controller electrically coupled to the cable. The device select system includes: a first portion having an array of first electrical contacts; a second portion having an array of second electrical contacts, there being more second electrical contacts than first electrical contacts, the second electrical contacts berg in electrical communication with the first and second arrays, each of the first electrical contacts being associated with at least two of the second electrical contacts; and a select mechanism for selectively placing each of the first electrical contacts in electrical communication with one of the second electrical contacts associated therewith.

In a further general embodiment, a method includes, during a first writing or reading operation, causing a device select system to create an electrical coupling between a first array of transducers on a first substrate to a cable, the cable being coupled to a controller; and during a second writing or reading, operation, causing a device select system to create an electrical coupling between a second array of transducers on a second substrate to the cable, the first array of transducers not being in electrical communication when the device select system creates the electrical coupling between the second array of transducers and the cable.

In yet another general embodiment, a system includes a first array of devices on a first substrate; a second array of devices on the first substrate; and a device select system coupled to the first and second arrays of devices. The device select system includes a first portion having an array of first electrical contacts; a second portion having an array of second electrical contacts, there being more second electrical contacts than first electrical contacts, the second portion being coupled to the first and second arrays of devices, each of the first electrical contacts being associated with at least two of the second electrical contacts; and a select mechanism for selectively placing each of the first electrical contacts in electrical communication with one of the second electrical contacts associated therewith.

Any of these embodiments may be implemented in a tape drive system, which may include a magnetic head, a drive mechanism for passing to magnetic recording tape over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE SEVERAL VIEWS OF THE DRAWINGS

For a fuller understanding of the nature and advantages of the present invention, as well as the preferred mode of use, reference should be made to the following detailed description read in conjunction with the accompanying drawings.

DETAILED DESCRIPTION

Figure 1:
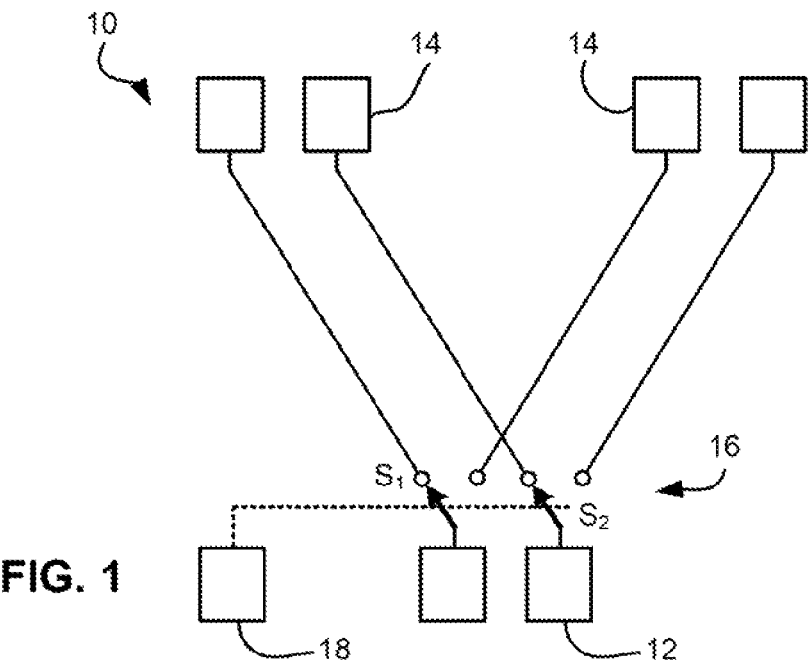
FIG. 1 is a system diagram of a device select system according to one general embodiment of the present invention.

The following description is the best mode presently contemplated for carrying out the present invention. This description is made for the purpose of illustrating the general principles of the present invention and is not meant to limit the inventive concepts claimed herein. Further, particular features described herein can be used in combination with other described features in each of the various possible combinations and permutations.

In the drawings, like and equivalent elements are numbered the same throughout the various figures.

It must also be noted that, as used in the specification and the appended claims, the singular forms "a," "an" and "the" include plural referents unless otherwise specified.

The embodiments described below disclose a new device select system that allows selective creation of electrical connections between electrical contacts for such things as selecting particular groups of devices and not others. Moreover, various embodiments allow selection of devices on different substrates. The system may be fabricated as a standalone unit, or integrated, into an intermediate or final device. In particularly preferred approaches directed to tape-based data storage systems, the device select system contains circuitry that enables writer and/or reader transducer device selection, thereby reducing the number of leads in the cable. The only other known solution is a complex, stiffer cable, or alternatively a multiplicity of cables, which suffers from the drawbacks mentioned above and is more costly. Alternatively, shrinking lead widths and spacing can negatively impact cable resistance and impedance.

In one general embodiment, a system includes a first device on a first substrate; a second device on a second substrate; and a device select system coupled to the first and second devices. The device select system includes: a first portion having an array of first electrical contacts; a second portion having an array of second electrical contacts, there being more second electrical contacts than first electrical contacts, the second portion being coupled to the first and second devices, each of the first electrical contacts being associated with at least two of the second electrical contacts; and a select mechanism for selectively placing each of the first electrical contacts in electrical communication with one of the second electrical contacts associated therewith.

In another general embodiment, a data storage system includes a first array of transducers on a first substrate; a second array of transducers on a second substrate; a device select system in electrical communication with the first and second arrays; a cable electrically coupled to the first portion of the device select system; a drive mechanism for passing a magnetic recording medium over the head; and a controller electrically coupled to the cable. The device select system includes: a first portion having an array of first electrical contacts, a second portion having an array of second electrical contacts, there being more second electrical contacts than first electrical contacts, the second electrical contacts being in electrical communication with the first and second arrays, each of the first electrical contacts being associated with at least two of the second electrical contacts; and a select mechanism for selectively placing each of the first electrical contacts in electrical communication with one of the second electrical contacts associated therewith.

In a further general embodiment, a method includes, during a first writing or reading operation, causing a device select system to create an electrical coupling between a first array of transducers on a first substrate to a cable, the cable being coupled to a controller; and during a second writing or reading operation, causing a device select system to create an electrical coupling between a second array of transducers on a second substrate to the cable, the first array of transducers not being in electrical communication when the device select system creates the electrical coupling between the second array of transducers and the cable.

In yet another general embodiment, a system includes a first array of devices on a first substrate; a second array of devices on the first substrate; and a device select system coupled to the first and second arrays of devices. The device select system includes a first portion having an array of first electrical contacts; a second portion having an array of second electrical contacts, there being more second electrical contacts than first electrical contacts, the second portion being coupled to the first and second arrays of devices, each of the first electrical contacts being associated with at least two of the second electrical contacts; and a select mechanism for selectively placing each of the first electrical contacts in electrical communication with one of the second electrical contacts associated therewith.

While much of the present description is presented in terms of implementation in a tape-based data storage system for clarity and to place the invention in a context, it should be kept in mind that the general concepts presented herein have broad applicability to electronic devices of other types.

FIG. 1 illustrates a device select system 10 according to one general embodiment. As shown, the system 10 includes an array of first electrical contacts 12 adapted for coupling to a cable. The first electrical contacts 12 may be pads present on the surface of the structure, apertures adapted to receive pins, pins adapted for insertion in apertures, pads or other contact mechanism located under subsequently-formed layers, etc.

An array of second electrical contacts 14 is also present and is adapted for coupling to devices such as transducers of a magnetic head. More second electrical contacts 14 are present than first electrical contacts. Each of the first electrical contacts 12 is associated with at least two of the second electrical contacts 14. It follows that each of the first electrical contacts 12 may be associated with three, four, five or more second electrical contacts 14. The second electrical contacts 14 may be pads present on the surface of the structure, apertures adapted to receive pins, pins adapted tar insertion in apertures, pads or other contact mechanism located under subsequently-formed layers, etc.

A select mechanism 16 selectively places each of the first electrical contacts 12 in electrical communication with one of the second electrical contacts 14 associated therewith.

In one embodiment, the select mechanism 16 includes an array of switches $S_1$, $S_2$, the array being for selectively placing each of the first electrical contacts 12 in electrical communication with one of the second electrical contacts 14 associated therewith. To control the select mechanism 16, one or more third electrical contacts 18 may be in electrical communication with the select mechanism 16 for passing control signals thereto.

The switches $S_1$, $S_2$, may simply be transistors, such as field effect transistors, bipolar junction transistors, or any of the many types of semiconductor gates. More elaborate switching mechanisms comprised, for example, of gate arrays known in the art may also be employed.

In one approach, the first and second electrical contacts and select mechanism of the device select system are formed in a common structure.

Figure 2A:
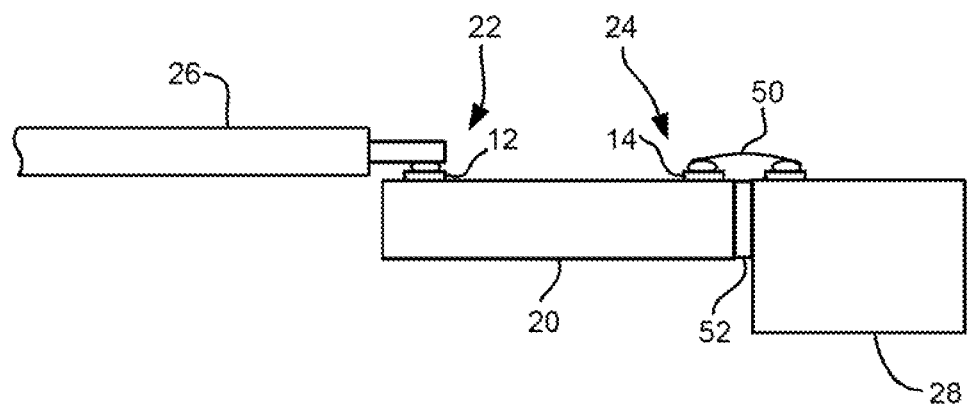
FIG. 2A is a side view of a device select system implemented in a single structure and adapted for coupling to a cable and a magnetic head, according to one embodiment of the present invention

Referring to FIG. 2A, one particularly preferred embodiment designed for coupling to a tape head includes a semiconductor chip 20, a first portion 22 which may be coupled to a tape head cable 26 and a second portion 24 of which may be coupled to a magnetic tape head 28.

The first portion 22 has an array of first electrical contacts 12 that cooperate with electrical contacts or exposed conductors on the cable 26 when coupled thereto. The electrical contacts or exposed conductors of the cable 26 may be attached to the chip 20 via any suitable bonding method known in the art. Preferred approaches use ultrasonic bonding methods or anisotropic conductive film (ACF).

The second portion 24 has an array of second electrical contacts 14, there being more second electrical contacts 14 than first electrical contacts 12. Each of the first electrical contacts 12 is associated with at least two of the second electrical contacts 14.

The magnetic head 28 has contacts corresponding to the second electrical contacts 14 on the chip 20, the head contacts typically being coupled to reader (and/or writer) transducers on the head 28. The second electrical contacts 14 of the chip 20 may be coupled to the electrical contacts on the magnetic head 28 via wires 50 using any suitable bonding method known in the art. Preferred approaches use ultrasonic or thermocompression bonding methods.

In a preferred implementation, the head 28 is bonded to the edge of the chip 20 using any known method, such as by application of an adhesive 52.

The arrangement of the electrical contacts 12, 14 on the various portions is not critical, and may vary depending on the cable and/or head design.

Figure 2B:
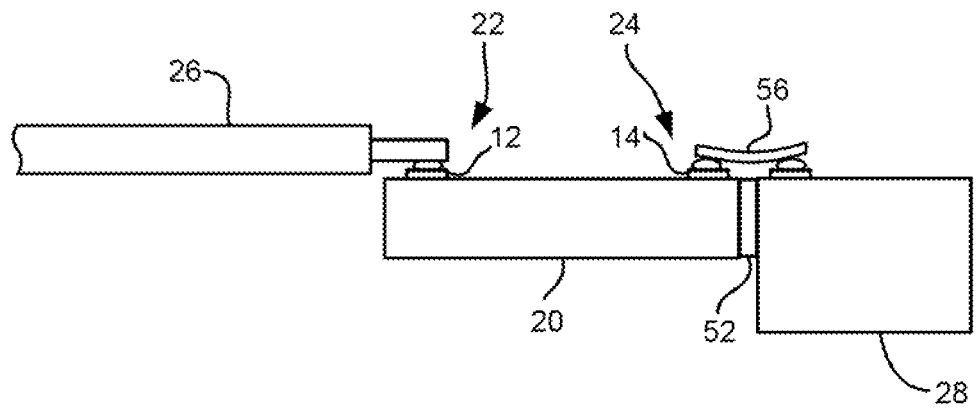
FIG. 2B is a side view of a device select system implemented in a single structure and adapted for coupling to a cable and a magnetic head, according to one embodiment of the present invention.

FIG. 2B depicts a variation of the embodiment of FIG. 2A. As shown in FIG. 2B, a bridge cable 56, sometimes called a coupon, is used to create the coupling between the second electrical contacts 14 on the chip 20 to the electrical contacts of the head 28.

The chip 20 includes the circuitry of the select mechanism that enables reader (and/or writer) transducer device selection, thereby reducing the number of required leads in the connecting cable 26. Preferably, the cable 26 has the only the leads needed to connect to one bank of reader (and/or writer) transducer devices on the head 28. For the conductive path to reader devices, the closed switch resistance is preferably small compared to the device resistance, which is typically 50-100 ohms. The open switch resistance is preferably >10 Kohm. Switching time is not typically a critical factor. The lines typically carry up to 15 mA DC or smaller. The signal is AC modulation of the DC bias voltage and has it bandwidth of approximately 10-50 MHz. For writer devices, the closed switch resistance is again preferably small compared to the DC coil resistance of the writer coil, which is typically 5-20 ohms. The writer currents are typically 10-50 milliamperes and the write frequency is typically in the range of 100-300 MHz, or higher.

Figure 2C:
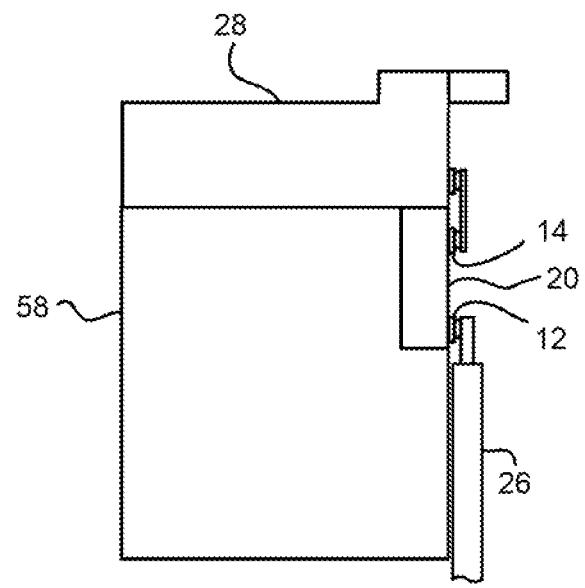
FIG. 2C is a side view of a device select system implemented in a single structure and adapted for coupling to a cable and a magnetic head, according to one embodiment of the present invention.

FIG. 2C illustrates another embodiment in which the chip 20 is positioned in a recess formed in a beam 58 supporting the head 28. The electrical connections between the chip 20, cable 26, and head 28 may be similar to those set forth above.

Figure 2D:
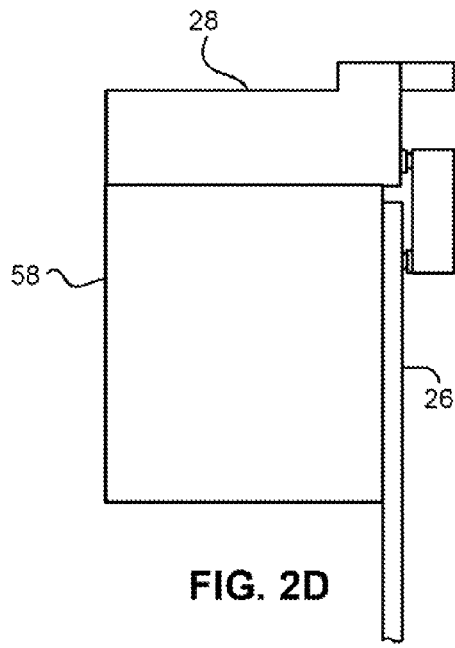
FIG. 2D is a side view of a device select system implemented in a single structure and adapted for coupling to a cable and a magnetic head, according to one embodiment of the present invention.

FIG. 2D illustrates yet another embodiment in which the second electrical contacts 14 of the chip 20 cooperate directly with the electrical contacts on the head 28. The electrical contacts or exposed conductors of the cable 26 may be attached to the first contacts 12 of the chip 20, and the contacts of the head 28 may be connected to the second electrical contacts 14 of the chip 20, via any suitable bonding method known in the art. Preferred approaches use ultrasonic bonding methods or anisotropic conductive film (ACF).

Figure 2E:
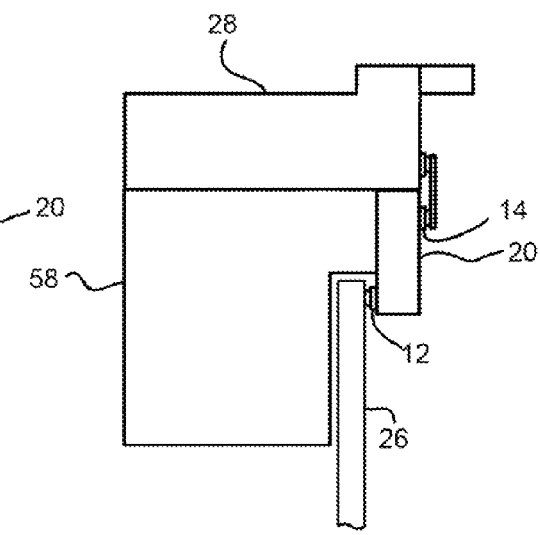
FIG. 2E is a side view of a device select system implemented in a single structure and adapted for coupling to a cable and a magnetic head, according to one embodiment of the present invention.

FIG. 2E illustrates yet another embodiment in which the first and second electrical contacts 12, 14 of the chip 20 are positioned on different surfaces.

Figure 2F:
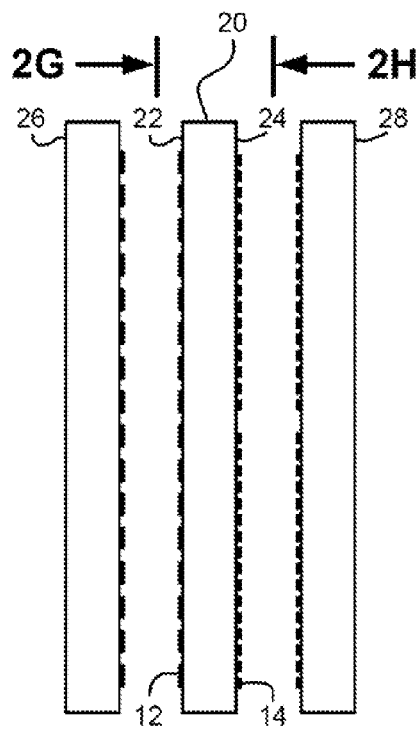
FIG. 2F is an exploded view of a device select system implemented in a single structure and adapted for coupling between a cable and a magnetic head, according to one embodiment of the present invention.

Referring to FIG. 2F one embodiment designed for coupling to a tape head includes a semiconductor chip 20, a first surface 22 which may be coupled to a tape head cable 26 and a second surface 24 which may be coupled to a magnetic tape head 28.

The first surface 22 has an array of first electrical contacts 12 that cooperate with electrical contacts on the cable 26 when coupled thereto. The cable 26 may be attached to the chip 20 via any suitable bonding, method known in the art. Preferred approaches use anisotropic conductive film (ACF) or ultrasonic bonding methods.

The second surface 24 has an array of second electrical contacts 14, there being more second electrical contacts 14 than first electrical contacts 12. Each of the first electrical contacts 12 is associated with at least two of the second electrical contacts 14. The second surface 24 may be coupled to the magnetic head 28, the magnetic head 28 having contacts corresponding to the second electrical contacts 14 on the chip 20, the head contacts typically being coupled to reader (and/or writer) transducers on the head 28. In a preferred implementation, the head 28 is bonded to the edge of the chip 20. The gold plate pads of the chip 20 and head 28 may be connected via, stitch bonding.

Figure 2G:
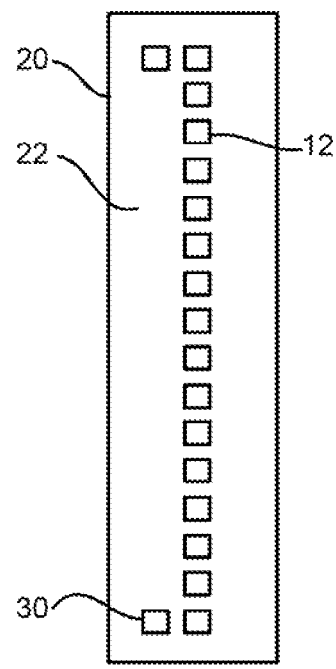
FIG. 2G is a side view taken from Line 2G of FIG. 2F.
Figure 2H:
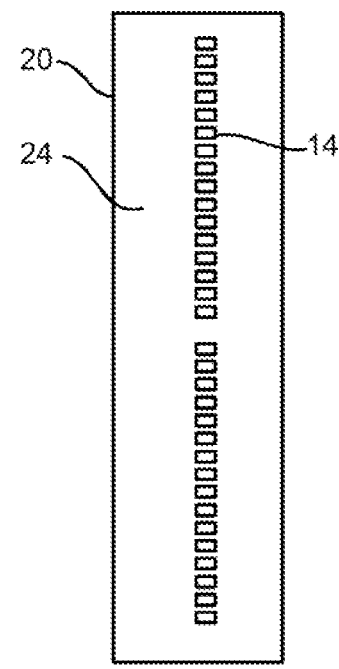
FIG. 2H is a side view taken from Line 2H of FIG. 2F.

The arrangement of the electrical contacts 12, 14 on the various surfaces is not critical, and may vary depending on the cable and/or head design. FIG. 2G illustrates how a first surface 22 may be configured. FIG. 2H illustrates one illustrative embodiment in which the second electrical contacts 14 for one set of devices are in one group, and the second electrical contacts 14 for a second set of devices are in another group.

Note that additional contacts may be present on either surface for such things as shared servo elements, control lines, etc. For example, as shown in FIG. 2G, one or more third electrical contacts 30 may be present on the first surface, and being in electrical communication with the select mechanism, allow passing, of control signals thereto. The various additional contacts may include direct connections with no select capability), selectable connections, and combinations thereof.

Figure 3:
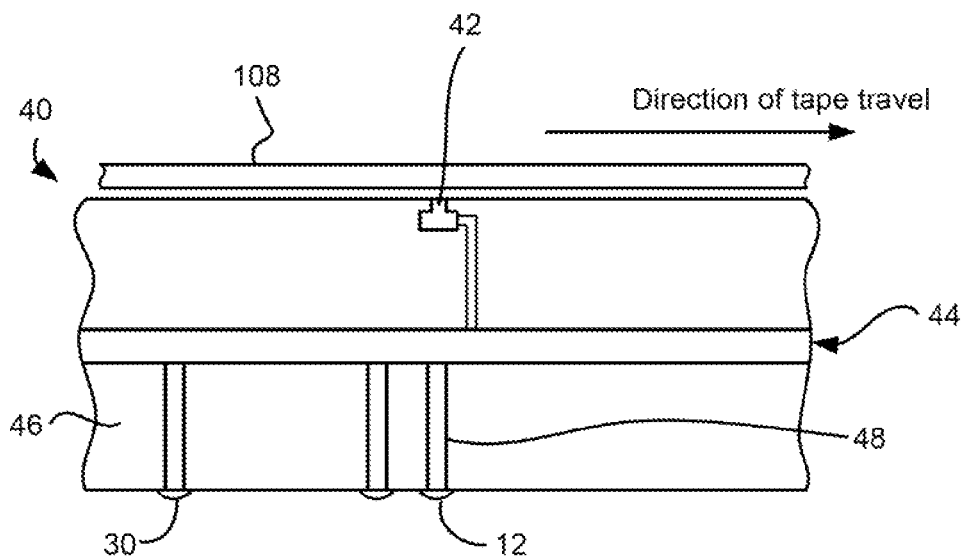
FIG. 3 is a partial cross sectional view illustrating a magnetic head with an integral device select system according to one embodiment of the present invention.

In another approach, the device select system may be integral to a larger system having the devices to be switched. As an example, FIG. 3 illustrates a magnetic head 40 with an integral device select system according to one embodiment. As shown, the head 40 includes an array of first electrical contacts 12 adapted for operative coupling to a cable. A plurality of reader and/or write transducers 42 are present on the head 40 (one shown) for reading or writing to the tape 108, there being more transducers 42 than first electrical contacts 12. Preferably, each of the first electrical contacts 12 is associated with at least two of the transducers 42. Again, additional electrical contacts 30 may be present for such things as servo reading, control of the select mechanism, etc. Further, additional transducers may be present, such as shared servo readers, etc.

The select mechanism 44 selectively places each of the first electrical contacts 12 in electrical communication with one of the transducers 42 associated therewith. The select mechanism may be implemented using any suitable fabrication technique including, thin film processing, printed circuit techniques, etc.

In a preferred approach, the select mechanism 44 includes a complementary metal-oxide-semiconductor (CMOS) circuit having a plurality of gates that perform the switching. The CMOS circuit may be formed above a substrate 46. Where the substrate 46 is as silicon wafer, for example, conductive vias 48 from the cable-side surface to the CMOS circuit may be formed by the silicon anisotropic etching process that is well known. The first electrical contacts 12 may include pads formed above the vias.

The transducers 42 may be formed above the substrate 46 and the layer housing the select mechanism 44 using traditional silicon insulator processes.

In other embodiments, selection of devices on different substrates is enabled. For instance, the output of the chip 20 in any of the embodiments described herein may be coupled to devices, such as transducers, on different substrates.

Figure 16:
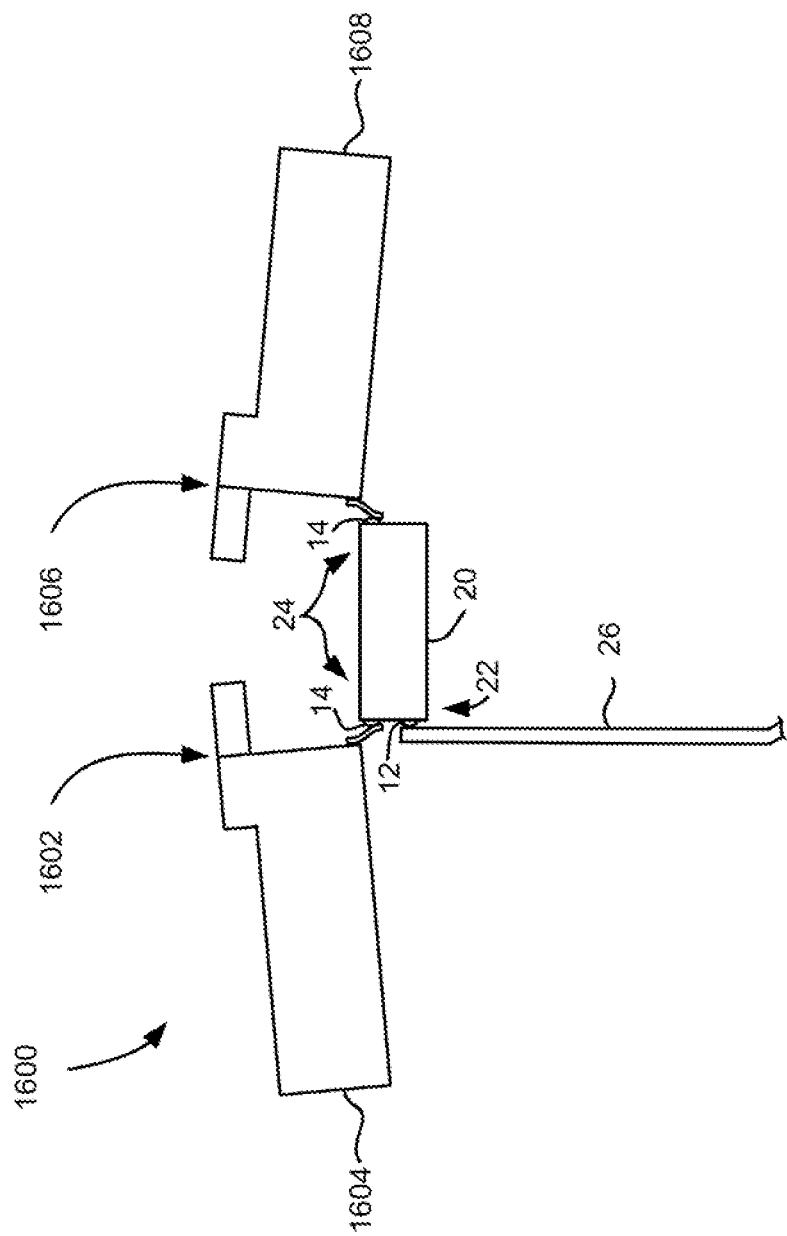
FIG. 16 is a side view of a device select system coupled to a cable and a magnetic head having two modules, according to one embodiment of the present invention.

FIG. 16 illustrates a system 1600 according to another embodiment. As shown, the system includes one or more first devices 1602 on a first substrate 1604 and one or more second devices 1606 on a second substrate 1608. In other words, the first and second devices are physically present on two different substrates, even though the two substrates may have at one time been a single substrate, e.g., wafer, that was diced into separate substrates after fabrication of the device. Moreover, the devices may have physical characteristics, known to those skilled in the art, that are characteristic of devices formed on the substrate on which each device resides.

In FIG. 16, this embodiment is described with reference to a pair of tape head modules, where the first and second devices 1602, 1606 are transducers, e.g. writers and/or readers in arrays on each respective substrate 1604, 1608. Such embodiment may be used with a storage system such as that shown in FIG. 15. However, it should be kept in mind that the first and second devices can be electronic devices in any environment, and the invention is not to be limited to data storage systems unless otherwise specified.

As shown FIG. 16, the first and second substrates 1604, 1608 are spaced apart. These substrates are typically coupled together via additional components. See, e.g., FIG. 4 in other approaches, the substrates are not coupled together.

Figure 17:
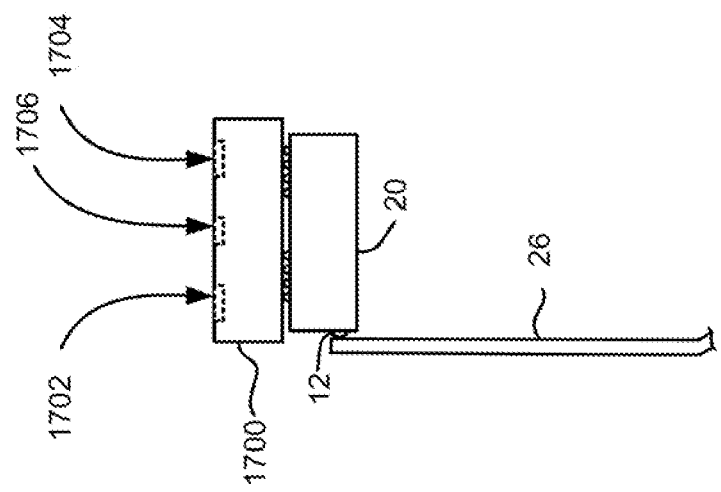
FIG. 17 is a side view of a system having a substrate coupled to a device select chip, according to one embodiment.

In other embodiments, the devices are spaced apart on single substrate which is not diced. Such an embodiment is illustrated in FIG. 17, which includes a substrate 1700 coupled to a device select chip 20. In the example shown, two arrays 1702, 1704 of writers, e.g., planar writers, are shown in shadow. The arrays 1702, 1704 of writers are formed on the same substrate. The direction of media travel, is from right to left, or vice versa, over the substrate 1700. The chip, which may be coupled to the substrate 1700 via any mechanism, e.g., wire bonding, solder balls, cabling, etc., may be used to select one of the arrays at a given time. An array 1706 of readers is also shown in shadow.

Referring to FIG. 16, a device select system 20 is coupled to the first and second devices 1602, 1606. The device select system 20 may have a configuration generally as described above, or a different configuration. Accordingly, in an illustrative embodiment, the device select system 20 may take the form of a chip, etc. and include a first portion 22 which may be coupled to a tape head cable 26 and a second portion 24 which may be coupled to the first and second devices 1602, 1606.

The first portion 22 may have an array of first electrical contacts 12 that cooperate with electrical contacts or exposed conductors on the cable 26 when coupled thereto. The electrical contacts or exposed conductors of the cable 26 may be attached to the chip 20 via any suitable bonding method known in the art. Preferred approaches use ultrasonic bonding methods, e.g., ultrasonic wire bonding directly to devices or their leads; ACF; soldering; ultrasonic or ACF cabling; thermal compression; etc.

The second portion 24 has an array of second electrical contacts 14, there being more second electrical contacts 14 than first electrical contacts 12. Each of the first electrical contacts 12 is associated with at least two of the second electrical contacts 14. Note that as shown in FIG. 16, the array of second electrical contacts 14 is split into multiple sections, one on each side of the chip. However, in other embodiments, the array of second electrical contacts 14 may be on a single side of the chip as in FIG. 2H.

A select mechanism, e.g., as described above, selectively places each of the first electrical contacts in electrical communication with one of the second electrical contacts associated therewith. One or more third electrical contacts may be in electrical communication with the select mechanism for passing control signals thereto. In the tape-based embodiment shown in FIG. 16, the select mechanism selectively places the first electrical contacts 12 in electrical communication with the first or second device(s) 1602, 1606. The device select system may also support Reliability, Availability, and Serviceability (RAS) functions as well.

The device select system 20 may be in close proximity to the devices, or even coupled to or integral with one or both of the substrates. In other approaches, the multiplexer may reside on another structure, such as a flexible cable or rigid circuit.

In a further variation, the device select system may select groups of devices present on both chips. For instance, the first substrate may have a first and a second device, while the second substrate also has a first and a second device. Accordingly, in one mode, the first devices on both substrates are coupled to the first electrical contacts, while the second devices on both substrates are coupled to the second electrical contacts in a second mode.

In another embodiment, the device select system couples multiple modules of a head having three or more modules. As an example, consider the head shown in 14. The device select system couples the outer modules 1192, 1104 of the three module head to a single cable. Accordingly, for a write-read-write (WRW) head, and with reference to FIG. 14, the tape passing in the direction shown is written by module 1102 and read by module 1106. The trailing module 1104 can be deselected. Accordingly, the amount of cabling to the device select system is significantly reduced. Moreover, the amount of circuitry in the controller that is needed to drive the writers is minimized.

In an illustrative method of use, during a first writing operation, causing a device select system to create an electrical coupling between a first array of transducers on a first substrate to a cable, the cable being coupled to a controller; and during a second writing operation, causing a device select system to create an electrical coupling between a second array of transducers on a second substrate to the cable, the first array of transducers not being in electrical communication when the device select system creates the electrical coupling between the second array of transducers and the cable. Such methodology is particularly useful for a WRW-configured system.

The foregoing methodology can be adapted to readers, and is particularly useful in a RWR system. Thus, for example, during a first reading operation, causing a device select system to create an electrical coupling between a first array of transducers on a first substrate to a cable, the cable being coupled to a controller; and during a second reading operation, causing a device select system to create an electrical coupling between a second array of transducers on a second substrate to the cable, the first array of transducers not being in electrical communication when the device select system creates the electrical coupling between the second array of transducers and the cable.

The following description describes several environments in which various embodiments of the present invention may be implemented or integrated.

Figure 4:
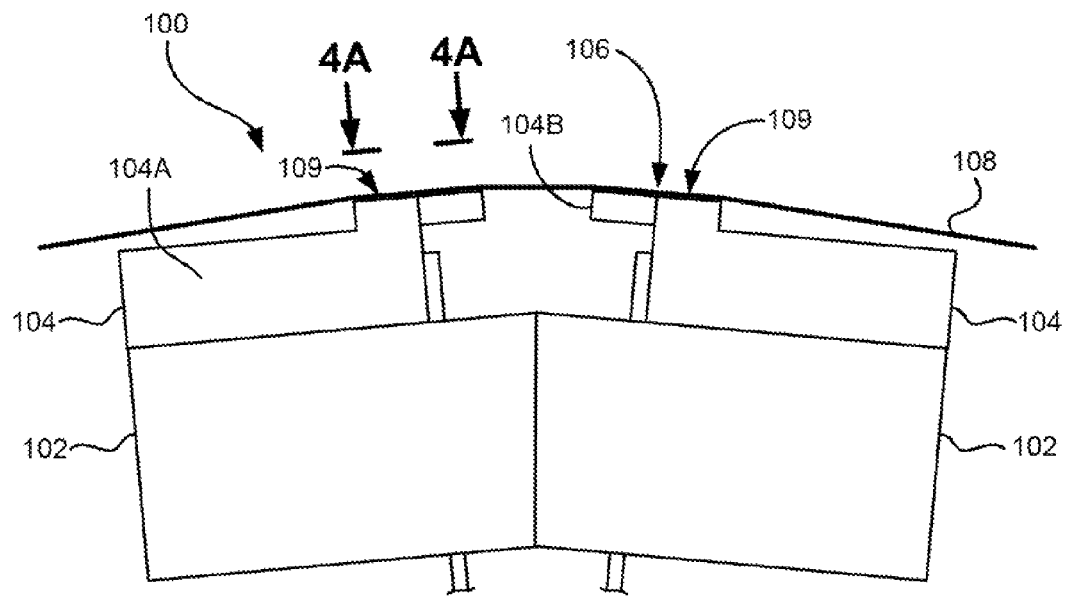
FIG. 4 is a side view of a traditional flat-lapped magnetic tape head.

FIG. 4 illustrates a traditional flat-lapped bi-directional, two-module magnetic, tape head 100, in accordance with one embodiment. As shown, the head includes a pair of bases 102, each equipped with a module 104. The bases are typically "U-beams" that are adhesively coupled together. Each module 104 includes a substrate 104A and a closure 104B with readers and writers 106 situated therebetween. In use, a tape 108 is moved over the modules 104 along a tape bearing surface 109 in the manner shown for reading and writing data on the tape 108 using the readers and writers 196. Conventionally, a partial vacuum is formed between the tape 108 and the tape bearing surface 109 for maintaining the tape 108 in close proximity with the readers and writers 106.

Figure 4B:
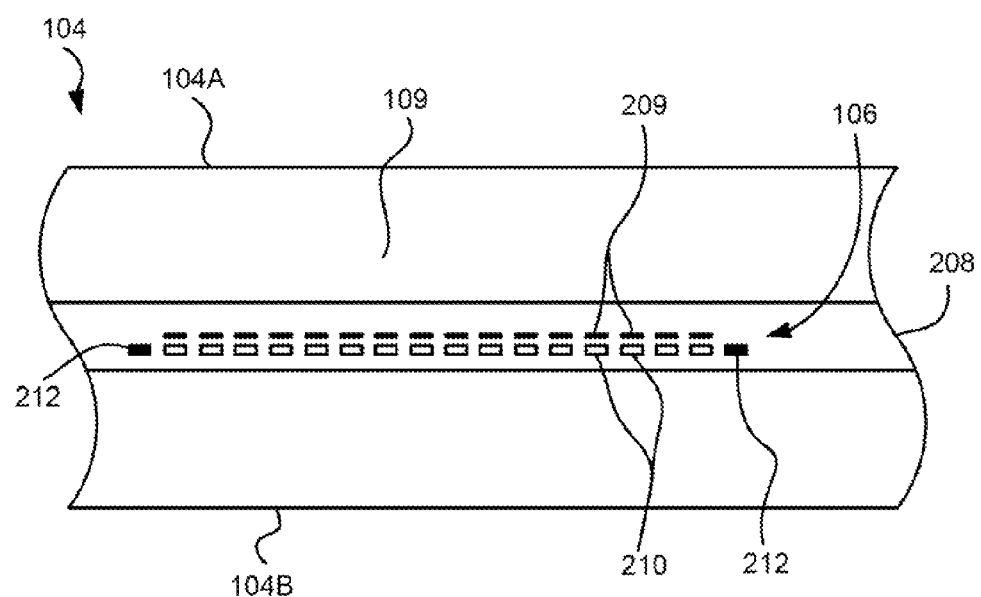
FIG. 4B is a detailed view taken from Circle 4B of FIG. 4A.
Figure 4A:
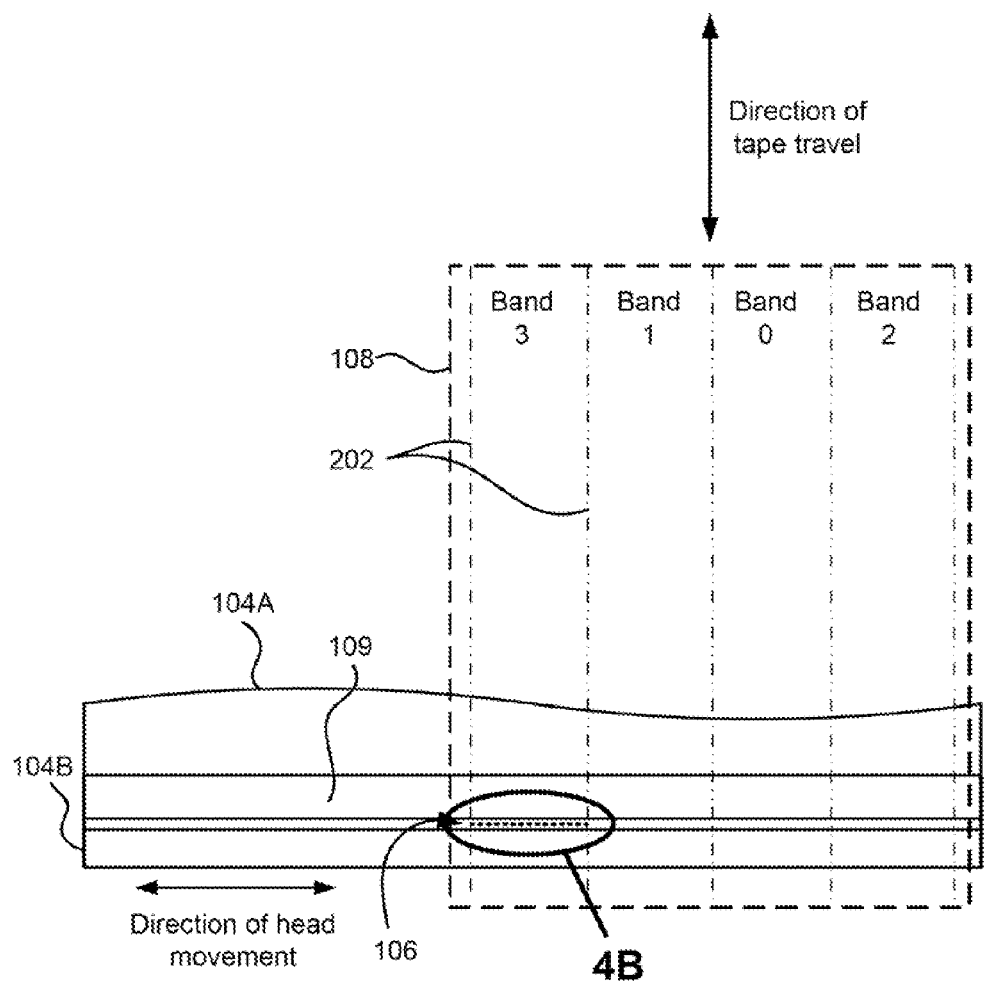
FIG. 4A is a tape bearing surface view taken from Line 4A of FIG. 4.

FIG. 4A illustrates the tape bearing surface 199 of one of the modules 104. The tape 108 is shown in dashed lines. The module is long enough to be able to support the tape as the head steps between data tracks.

As shown, the tape 108 includes four data bands (Band 0-3) that are defined between servo tracks 202. Each data band may include a number of data tracks, for example 96 data tracks not shown). During read/write operations, the elements 106 are positioned within one of the data bands. Outer readers, sometimes called servo readers, read the servo tracks 202. The servo signals are in turn used to keep the elements 106 aligned with a particular track during the read/write operations. Typically, a coarse positioner (worm gear, etc) places the head generally adjacent a given data track, then a fine positioner (voice coil, etc.) keeps the heads aligned using the servo tracks.

FIG. 4B depicts a plurality of read/write elements 106 formed in a gap 208 on the module 194 of FIG. 4A. As shown, the array of elements 106 includes, for example, sixteen writers 209, sixteen readers 210, and two servo readers 212. As noted by considering FIGS. 4 and 4A-B together, each module 104 will include a complementary set of elements 106.

As mentioned above with reference to FIG. 4, a typical tape head includes two modules, each module having an array of data elements thereon for reading and/or writing data in a particular data format. The present invention may be implemented in the context of a two module head capable of reading and/or writing in two different data formats. One skilled in the art will also appreciate that the embodiments herein can also be expanded to heads having a single module (where, for example, the single module may be formed on a single substrate) and heads having more than two modules. The present invention may also be implemented in the context of a head where modes such as the ability to read and/or write are selectively enabled.

The device select system is particularly useful with multi-format heads. Some illustrative multi-format heads are presented below. The device select system allows selection of the various transducer arrays without requiring cabling for each individual transducer. The device select system may thus be used for multi-format arrays in which the multiple formats are separated into different modules, built on multiple planes on the same module, built using a scheme of interleaving and sharing, and/or side by side.

Figure 5:
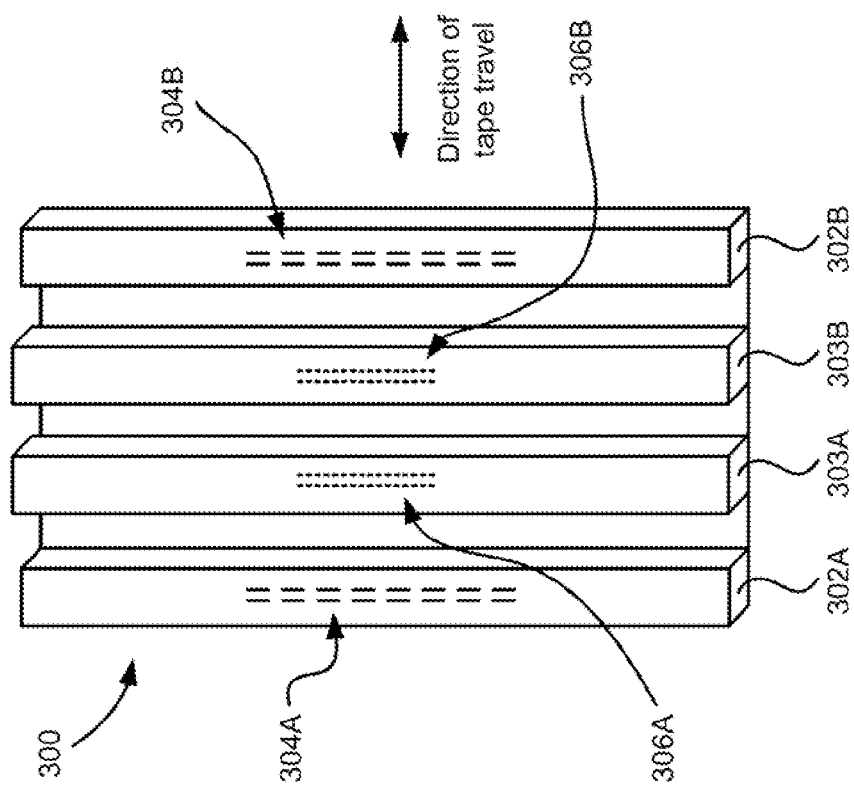
FIG. 5 is a tape bearing surface view of a head including multiple format read/write elements on different modules.

FIG. 5 illustrates a multi-format head 390. As shown, the head 300 includes two sets of modules, an outer pair of modules 302A, 302B, and an inner pair of modules 303A, 303B aligned in a direction parallel to the direction of tape travel relative to each other. The outer pair of modules 302A, 302B each has an array of complementary elements 304A, 304B arranged according to a first format, while the inner pair of modules 303A, 303B each has an array of complementary elements 306A, 306B arranged for a second format different than the first data format. In both pairs, the complementary elements (304A with 304B, 306A with 306B) are displaced from each other in the direction of tape travel. When media in the first format is presented to the system, the array of elements 304A, 304B in the outer pair of modules 302A, 302B are operated. When media in the second format is presented to the system, the array of elements 306A, 306B in the inner pair of modules 303A, 303B are operated.

In read-while-write operation in the first format for example, the readers on the trailing module 302B read the data that was just written by the leading module 302A so that the system can verify that the data was written correctly. If the data is not written correctly, the system recognizes the error and rewrites the data.

Figure 6A:
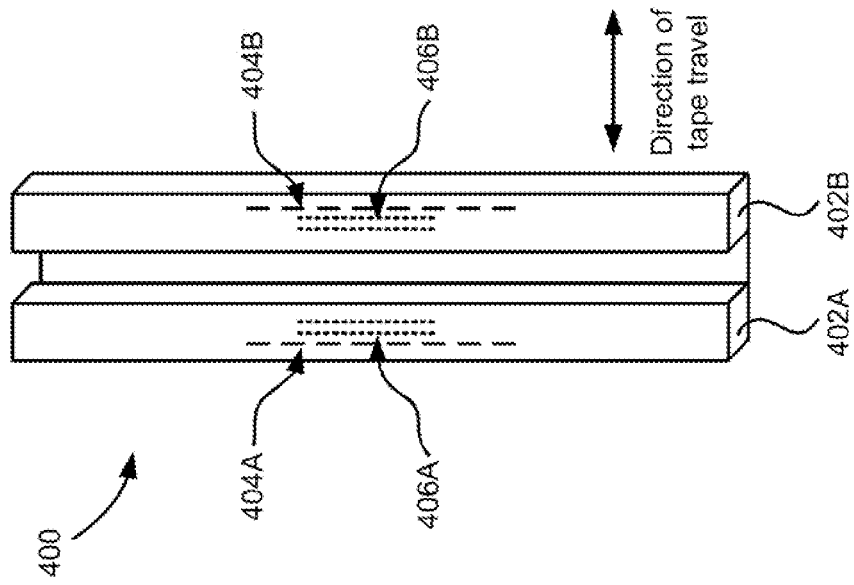
FIGS. 6A and 6B are tape bearing surface views of heads including multiple format read/write element arrays on the same module.

Another multi-format head 400 is shown in FIG. 6A. This tape head 400 is composed of Read-Read-Write (R-R-W) modules. Tape head 400 includes merged primary data format read/write elements 404A, 404B and secondary data format read elements 406A, 406B on each module 402A, 402B, in this instance, head 404 is capable of reading a secondary format corresponding, to secondary format read elements 406A, 406B. Head 400 is further capable of both reading and writing with the primary format corresponding to primary read/write elements 404A, 404B.

With continued reference to FIG. 6A, the primary and secondary elements 404A, 404B, 406A, 406B are aligned parallel to the direction of tape travel, relative to each other. Typically, each row of elements is lubricated in sequential fabrication sequences. For example, elements 404A, 404B may be formed first. Then the secondary elements 406A, 406B are fabricated above the primary elements 404A, 404B.

Figure 6B:
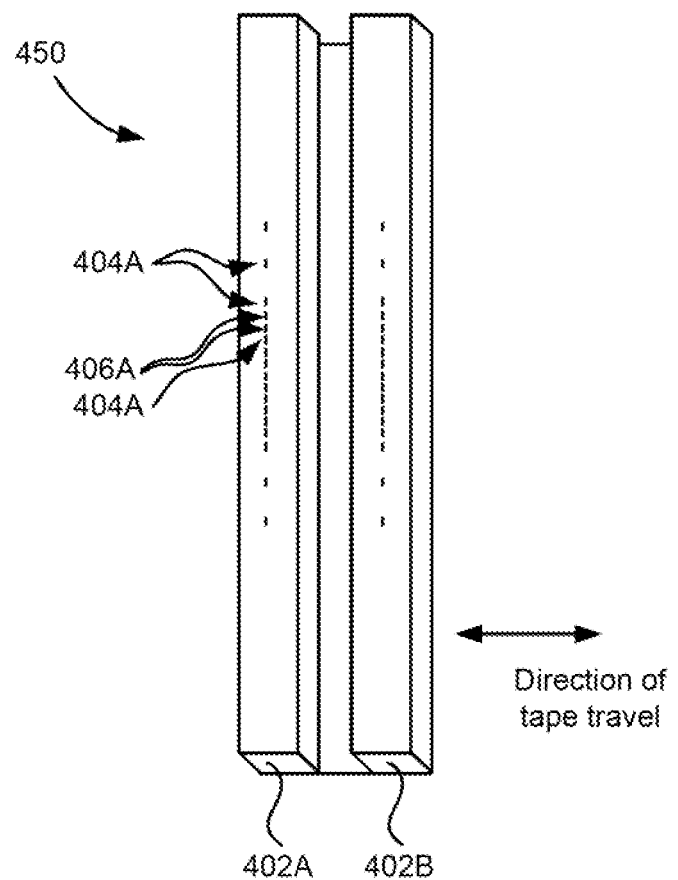

FIG. 6B depicts an alternate embodiment 450 with elements of the reduced span array (new format) 404A interleaved with, and possibly sharing, elements 404B of the legacy array (old format).

Figure 7:
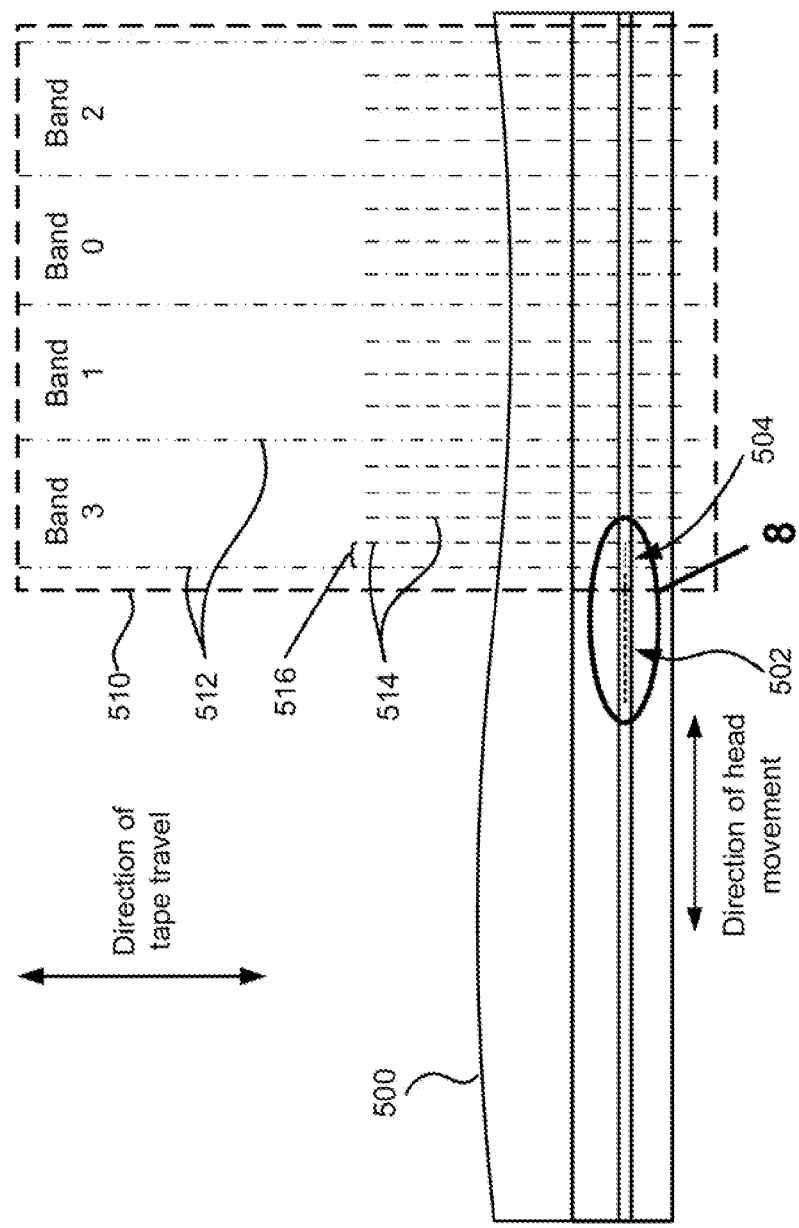
FIG. 7 is a tape bearing surface view of a tape head including two arrays of elements on the same module, each array being adapted for a different format.

FIG. 7 illustrates a tape bearing surface view of a module 500 having a first array 502 of elements associated with a first data format, and a second array 504 of elements associated with a second data format, where the first and second data formats are different. Again, the elements can include readers, writers, or both, and typically at least two modules are present to provide read-while-write capability.

The tape 510 is shown in dashed lines. While it is not typical to write data in two different formats on the same tape, the present embodiment would enable this feature, as described below. To illustrate different formats, FIG. 7 shows data in the first and second formats overlapping. This is for illustration purposes, and one skilled in the art will appreciate that the data bands in the two formats would not typically be concurrently present on the same area of the tape. Data in the first format is associated with servo tracks 512 and data bands (Band 0-3). Data in the second format is associated with servo tracks 512 and 514. The data bands 516 in the second format are significantly smaller and so are not individually identified alphanumerically. However, a representative data band 516 is shown in FIG. 7 for illustrative purposes.

The second data format may be a new generation relative to the first data format. The first and second data format may also be a formats used by competing vendors, used in different standards, etc. Typically, the differences between formats will include one or more of differing servo band locations, differing, written track width, differing track density per data band or tape width, differing, track centerline-to-centerline spacing, differing element centerline-to-centerline spacing, etc. Accordingly, the arrays will have servo reader position, element spacing, element width, etc. that are designed to function in the format with which associated. Another embodiment includes two arrays that each use different read and/or write gaps to allow reading and/or writing in different data densities.

In one embodiment, the second format is a scaled-down version of the first format, especially in feature size. Accordingly, the second may 504 would then be a scaled-down version of the first array 502. For example, the second array 504 may have the same number of data tracks per band, but is scaled down from the first array 502, for example by a factor of about 5. In other words, the second array 504 is about 20% the width of the first array 502. Thus, the format characteristics are also scaled down. For example, the track density on the tape should increase by approximately 5× in the second format as compared to the first format if the linear data density also doubles, the tape capacity in the second format will be 10× the first format.

Furthermore, the advanced format data organization, e.g. track layout, is not necessarily in any way coupled to the legacy format. Coupling, as by forcing a sharing of elements, as depicted in FIG. 6B, may not be desirable as it may force compromised future areal density or degraded head performance.

With continued reference to FIG. 7, the first and second arrays 502, 504 are formed in the same gap on the module 500 and are generally aligned laterally adjacent to each other in a direction transverse to the direction of media travel.

In operation, the tape drive system or host system can identify the format of the servo pattern on the tape and/or the format of the data on the tape using one of several techniques. One way to determine the format(s) is by reading, a cartridge memory chip in the tape cartridge that identifies the format. Another way to identify the format is by reading a small portion of the data bands and matching, for example, the servo tracks to a look up table (LUT). Note that all arrays may be active at this time, or the system may sequentially operate the arrays. In other embodiments, the user may indicate which format is used on the tape. Once the format is identified, the controller, host, or user selects the proper array for reading, and writing. The system energizes the array associated with the identified format, such as by energizing the leads coupled to the desired array. Now active, the desired array is aligned with one of the data bands in a standard way, e.g. by servoing, and the tape is passed over the head for reading/writing. Preferably, either one array or the other is energized at a time during standard read/write operations.

In one embodiment, the elements for both arrays 502, 504 are built simultaneously during thin film buildup. For instance, consider elements in a "piggyback" configuration. This type of element typically includes a reader formed on a substrate, with a writer formed thereon. The reader and writer may be positioned so that one of the reader shields also functions as a component of one of the writer poles. During construction of a multi-format piggyback head, the readers of the first array 502 are formed concurrently with the readers of the second array 504. Then the writers of the first array 502 are formed concurrently with the writers of the second array 504. The readers of the first and second arrays 502, 504 are aligned along a line transverse to the direction of media travel, and thus the writers of both arrays are also aligned. Likewise, for an interleaved head, the readers for both arrays 502,504 can all be formed during a single processing sequence, and the writers can be formed in another processing, sequence.

The arrays can be slightly offset in a vertical direction for design considerations. For example, the upper shields for readers in the first array may be formed concurrently with the lower shields for readers in the second array. Then the readers in the second array are completed in subsequent steps. Thus, in some embodiments, the elements are formed concurrently in the same processing sequence, though only some of the processing steps affect both arrays 502, 504.

In further embodiments, the arrays can be formed by independent processing, sequences. For example, one array can be completed prior to forming the other array. The arrays may be aligned in a direction transverse to the direction of tape motion, or can be displaced transverse to the direction of tape travel and offset in a direction parallel to the direction of tape travel.

Further, each array can be formed on an individual module, where the arrays in each format are displaced transverse to the direction of tape travel.

Forming the various arrays concurrently reduces process steps over the contemplated methods described above, such as forming elements in tandem parallel to the tape travel direction or even placing R/W arrays for different formats on different modules. One skilled in the art will appreciate the advantages achieved by processing all of the elements concurrently, including lower cost, faster production time, reduced chance of error, etc. Write and read transducer magnetic gaps may be independently optimized for each format.

Because the arrays 502,504 of elements are adjacent each other laterally, the width of the head may need to be increased slightly to ensure that the tape bearing surface supports the entire tape at all possible positions. However, the width of the head does not necessarily need to increase.

Figure 8:
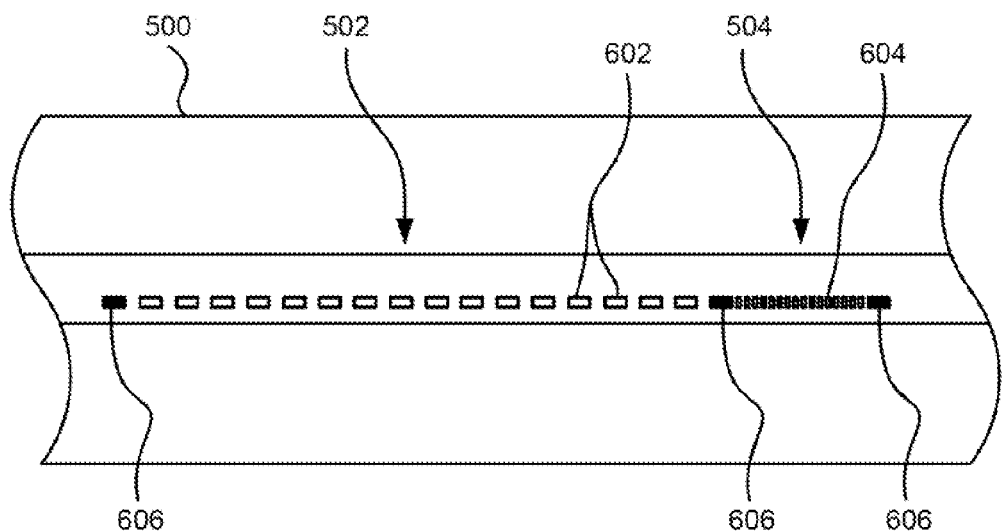
FIG. 8 is a detailed view taken from Circle 8 of FIG. 7 showing two arrays of elements according to one embodiment.
Figure 9:
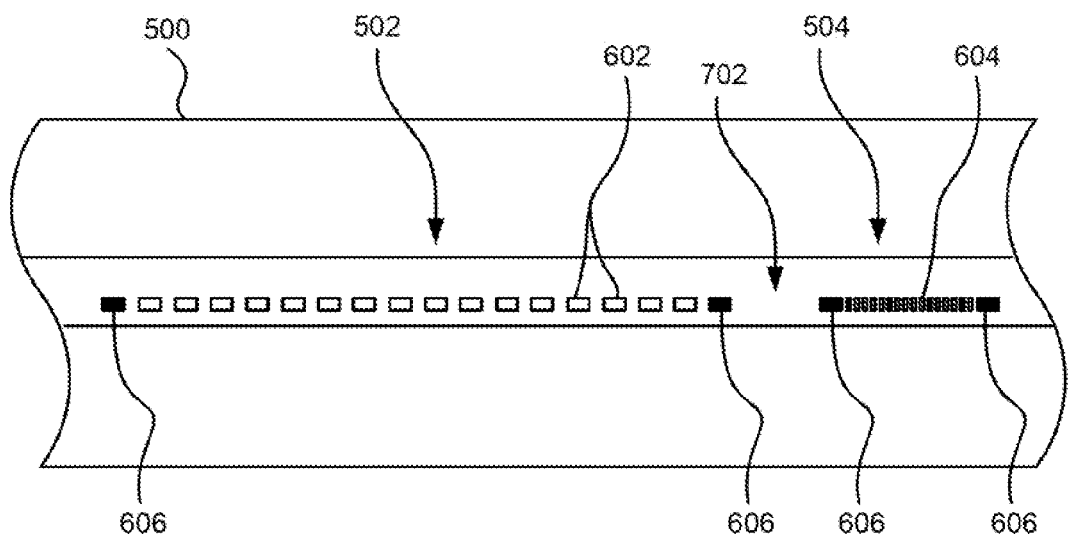
FIG. 9 is a detailed view of a tape bearing surface of a tape head showing two arrays of elements spaced apart laterally.

One embodiment of the present invention is illustrated in FIG. 8, wherein two arrays 502, 504 are formed on a module 500. As shown, the elements 602 of the first array 502 and the elements 604 of the second array 504 are positioned generally laterally adjacent each other. In some embodiments, including, this one, the first and second arrays 502, 504 can share one of the servo readers 606. However, it may be advantageous to space the second array 504 laterally from the first array 502, as shown in FIG. 9.

One advantage of spacing the arrays 502, 504 apart is that because portions of the tape near or at the edges of the tape may tend to induce more wear on the head than other parts of the tape, the area of greatest wear may then be between the arrays (when reading outer data bands). This is particularly so with older tapes that tend to be rougher and thicker, and produce more wear than newer tapes, as newer tapes are designed to reduce wear. The consequence of the uneven wear pattern is that when reading and writing the outer band of a tape in the first format with the first array 502, the edge of the tape might cause wear adjacent to the first array 502, and thus on the second array 504. By having the arrays spaced apart slightly, wear from the edge portions of the tape will occur between the arrays, e.g., in area 702.

It is worth noting that the same uneven wear patterns might occur when reading and writing using the second array 504, i.e., the edge portions of the tape will cause more wear adjacent the second array 504, and as such, the wear will likely occur on the first array 502. However, assuming the second array 504 is for a format that is more modern than the format of the first array 502, the tape will likely be a newer tape that is smoother. Further, the first array 502, probably having larger elements and reading, a lower linear density, may be more tolerant to wear. Furthermore, all elements may be provided with a wear resistant coating such as diamond-like carbon.

Figure 10:
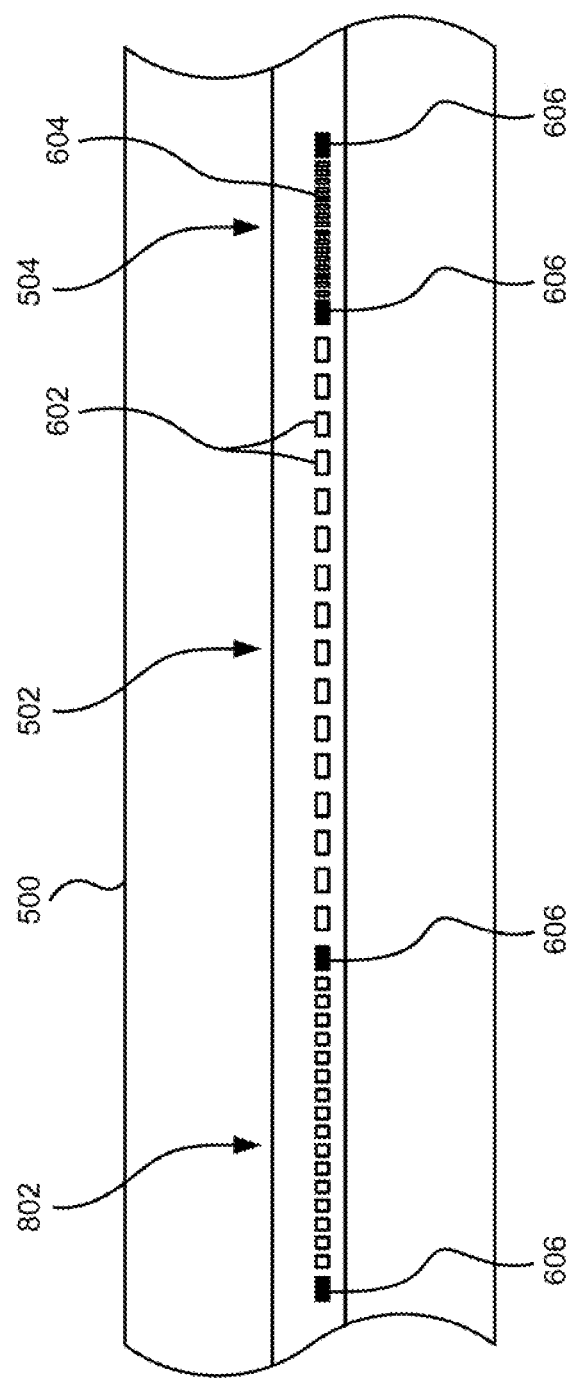
FIG. 10 is a detailed view of a tape bearing surface of a tape head showing three arrays of elements, each for a different format.

Additional embodiments have more than two arrays of elements aligned on a single module, each array associated with a different format. FIG. 10 illustrates an embodiment where three arrays 502, 504, 802 of elements are present. Again, the arrays may share servo elements or not.

Figure 11:
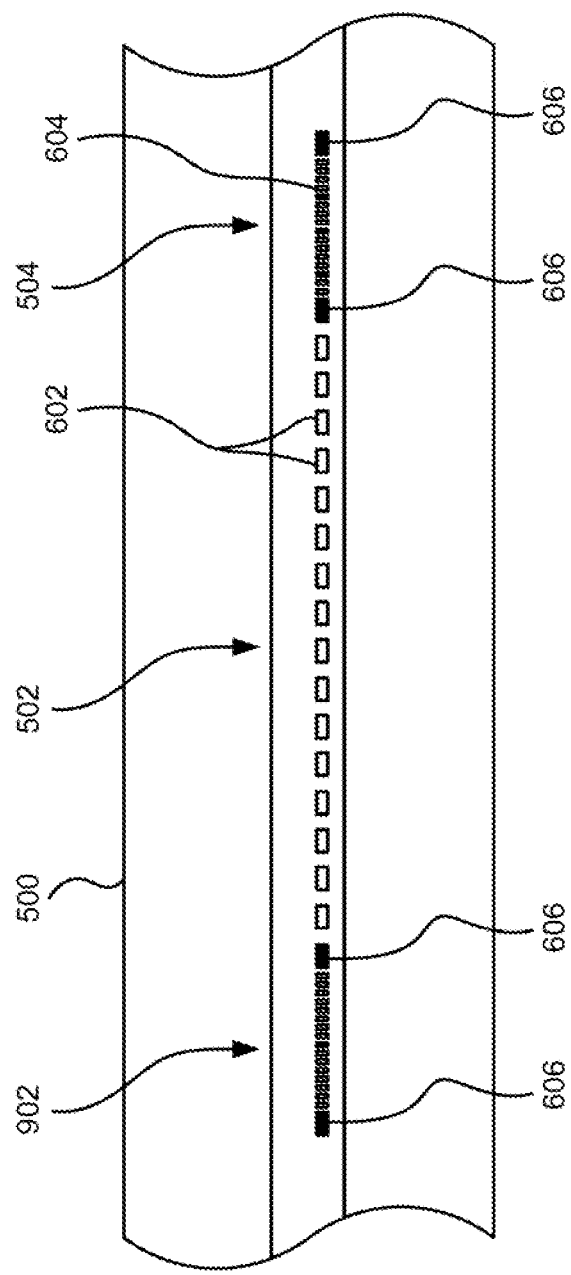
FIG. 11 is a detailed view of a tape bearing surface of a tape head showing three arrays of elements, where one of the arrays is for a first format and two of the arrays are for a second format.

If head width is a critical issue, and assuming that the second array 504 is not was wide as the first array 502 in a direction transverse to the array of elements, a second array 504 and a substantially identical third array 902 can be formed, one either side of the first array 502. This embodiment is shown in FIG. 11. For data tracks in the second format and positioned on the left side of the tape, the third array 902 (on the left) will read and write data track in the second format on the left side of the tape. For data tracks in the second format and on the right side of the tape, the second array 504 (on the right) will read and write. In this way, the head does not need to have a width that is more than would be required to read or write using the first array 502. Rather, one or both of the second array 504 and the third array 902 will be over data tracks in the second format at any point where the first array 502 is over the tape, thereby reducing the lateral range of motion required for the head to access all data tracks on the tape. Thus, for example, the head need not be wide enough to allow the first array 502 to extend beyond the left edge of the tape to allow the second array 504 to read data along the left tape edge. Rather, the data along the left tape edge can be read by the third array 902. Additionally, fabricating both the second and third arrays 504, 902 may enable using only one chip mace for fabricating both left and right modules in a two module head rather than requiring individual chip images or wafers for left and right modules.

Figure 12:
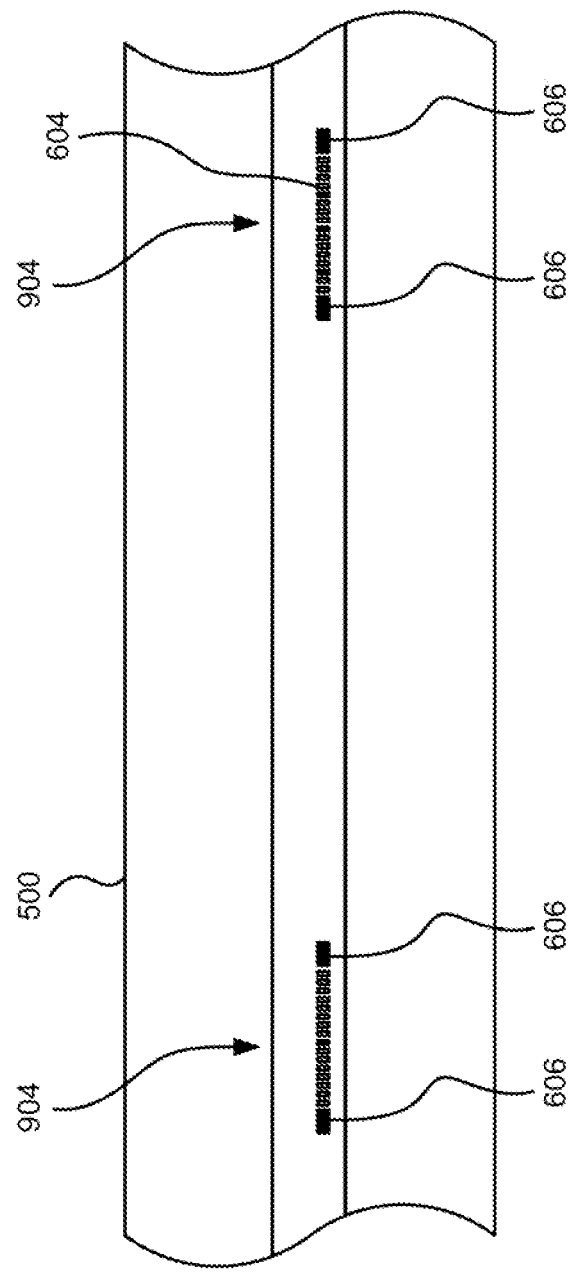
FIG. 12 is a detailed view of a tape bearing surface of a tape head showing two arrays of elements, where both of the arrays are for a same format.

FIG. 12 illustrates a head having two identical arrays 904 that are spaced apart. This embodiment addresses the issue of head width constraints, as the outer arrays do in the embodiment of FIG. 11. Thus, the head of FIG. 12 operates in a substantially similar manner as the head of FIG. 11 when reading or writing in the new format.

In another mode of use, multiple formats can be written to the same tape. Because the arrays are aligned transverse to the tape travel direction, data in each format can be simultaneously written along the tape. This feature would allow, for instance, data to be written in two parallel tracks on the same tape and sent to users having a tape drive capable of reading only one of the formats. Because many blank tapes are sold with servo information already written thereto, some embodiments may require tapes that have servo information for both formats thereon. Other embodiments may write servo information simultaneously with the data, and servo writers would be present in each array. Yet other embodiments may allow writing of the new format onto an adjacent data band. For example, if the tape has four data bands, the bands can be grouped into two pairs. Using the servo track between the pair of bands to align the arrays over each hand, one format can be written to one band and another format to the other band. The latter may not be optimal for the newer format, which might require an improved servo data band.

Figure 13:
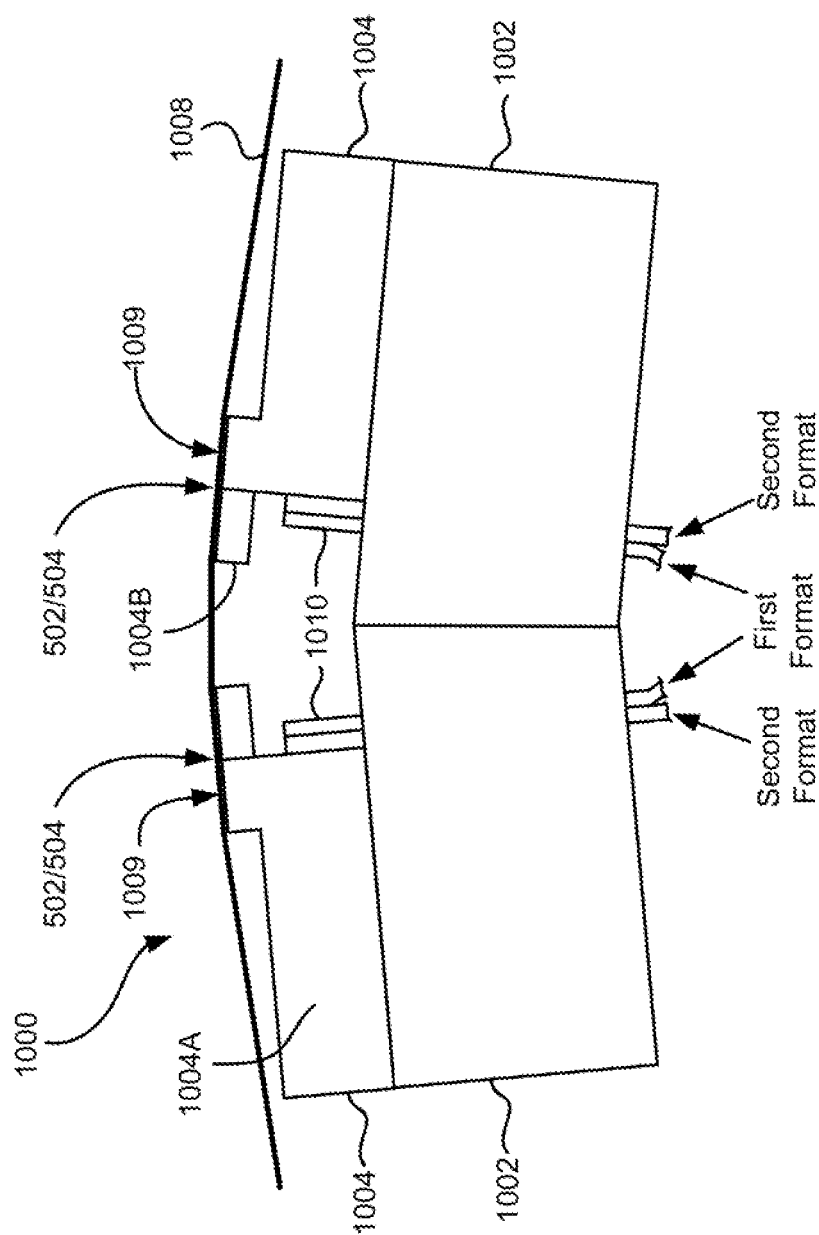
FIG. 13 is a side view of a tape head having two modules according to one embodiment.

As mentioned above, one way to build the head is to have two modules, in a configuration similar to existing, heads, e.g., the head of FIG. 4. One such embodiment, shown in FIG. 13, includes a flat-lapped bi-directional, two-module magnetic tape head 1000. As shown, the head includes a pair of bases 1002, each equipped with a module 1004. The bases may be conventional U-beams that are adhesively coupled together. Each module 1004 includes a substrate 1004A and a closure 1004B with multiple arrays 502, 504 situated therebetween. Cables 1010 connect the elements to a controller. The cables 1010 are shown as split into leads for the two formats, but can be joined, fused, intermixed, overlayed, etc. In use, a tape 1008 is moved over the modules 1004 along the tape bearing surfaces 1009 thereof for reading and writing data on the tape 1008. Depending on the format of the data or servo on the tape, the array 502 or 504 on each module corresponding to that format is activated and used to read and/or write to the tape.

Another way to build the head is to have the functions of reading and writing performed on different modules. As shown in the write-read-write (W-R-W) head 1100 of FIG. 14, outer writing modules 1102, 1104 flank a single reading module 1106. As the names imply, the outer modules 1102, 1104 include two or more arrays of writers in a configuration, for example, as shown in FIGS. 8-12. The reading module 1106 includes two or more arrays of readers. The modules 1102, 1104, 1106 are offset and set in relationship with each other such that internal wrap angles are defined between the modules 1102, 1104, 1106. Cables 1109 connect the elements to a controller. The cables 1109 are shown as split into leads for the two formats, but can be joined, fused, intermixed, overlayed, etc.

In this embodiment, the tape bearing surfaces of the modules lie on parallel planes, but are offset in a direction perpendicular to the planes. When the tape 1108 moves across the head 1100 as shown, air is skived from below the tape 1108 by a skiving edge 1110 of the first outer writing module 1102, and instead of the tape 1108 lifting from the tape bearing surface 1112 of the first outer module 1102 (as intuitively it should), the reduced air pressure in the area between the tape 1108 and the tape bearing surface 1112 allow atmospheric pressure to urge the tape towards the tape bearing surface 1112. A trailing end 1120 of the outer writing module 1102 (the end from which the tape leaves the outer writing module 1102) is the reference point which defines the wrap angle $\alpha_o$ over the tape bearing surface of the inner reading module 1106. The same is true of the other outer writing module 1104 when the tape travel direction is reversed.

Figure 14:
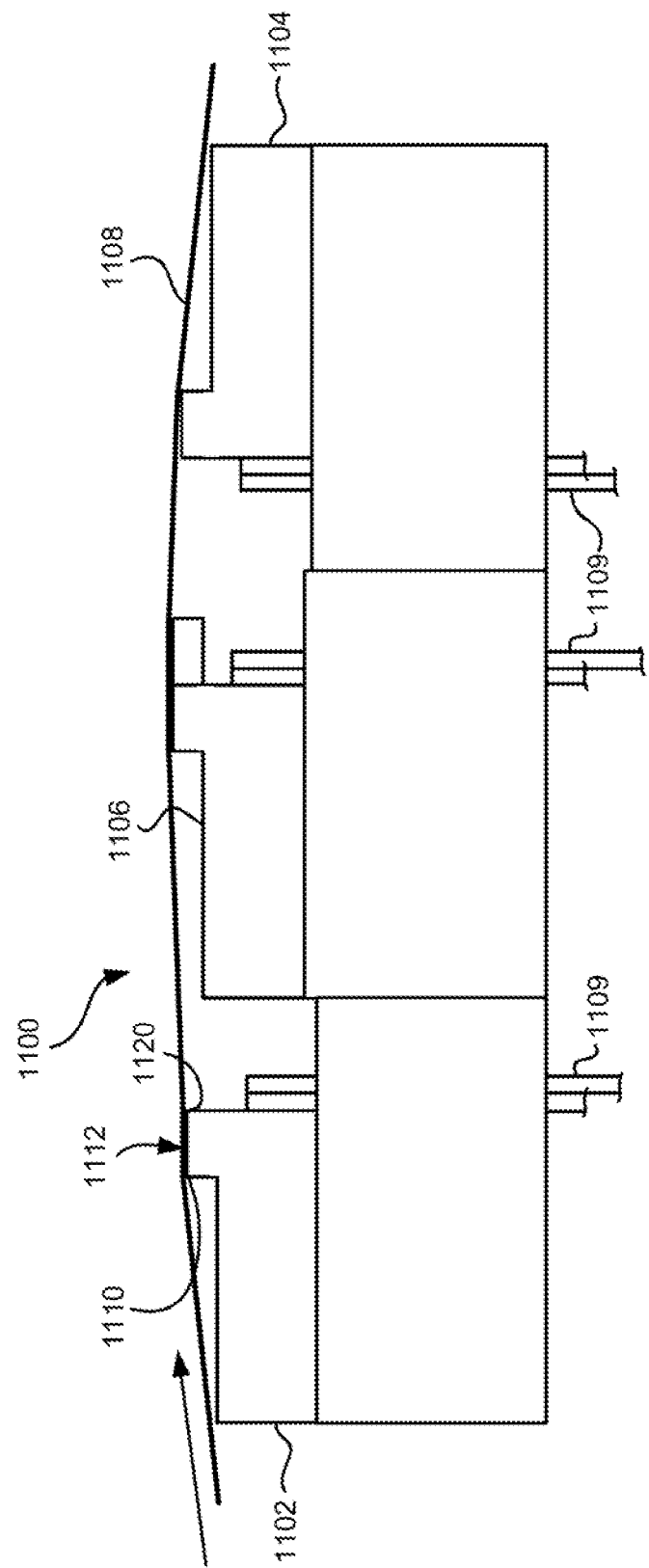
FIG. 14 is a side view of a tape head having three modules according to one embodiment.

Variations on the head 1100 of FIG. 14 include a R-W-R head, a R-R-W head, a W-W-R head, etc. For example, in a R-W-R head, the outer modules 1102, 1104 perform reading while the middle module 1106 performs writing. In a R-R-W head, the leading module 1102 and middle module 1106 perform reading while the trailing module 1104 performs writing. In a W-W-R head, the leading module 1102 and middle module 1106 perform writing while the trailing module 1104 performs reading. Again, the leading and trailing modules 1102, 1104 may operate concurrently with each other and the middle module 1106, may operate individually, or may operate in combinations of two modules.

An advantage of the multiple module head is that each module has no more wiring leads than a module in a two module head having both read and write elements. For instance, assume a legacy format head has 16 readers and 16 writers per module. Adding an array of second format elements would add 32 more elements, or 64 more wires. However, if each module has only readers or writers, albeit in two formats, the number of wires per module is the same as the legacy read/write head. Accordingly, existing cabling can be used, the number of wires per head is minimized, etc.

Another advantage is that air is entrained between the tape and the trailing outer module (1104 in FIG. 14), thereby reducing wear.

The three module design is also preferred, as the total gap thicknesses and build complexity are minimized, and head yield is optimized.

Compatible hardware is not limited to flat profile heads; heads having rounded and other geometric tape bearing surfaces are also within the spirit and scope of the present invention.

Likewise, other types of multi-format heads may include heads having elements of the reduced span array (new format) interleaved with, and possibly sharing, elements of the legacy array (old format).

In any of the embodiments described herein, the heads can be fabricated in conventional was. To reduce cost and complexity, one lead for an element of the first array may be commoned with one lead for an element of the second array (and so on for additional arrays) to minimize head wiring, an on-going goal in head design.

A data storage system as described herein may include one or more of the following components. A device for interfacing with a data medium is present in some embodiments. Examples of such an interface device include a drive, socket, bay, etc. that interfaces with a data medium. For example, in a tape-based data storage system, a drive is used to read and write to tape, the drive including a bay for a tape cartridge. The data storage system may include a plurality of interface devices.

Figure 15:
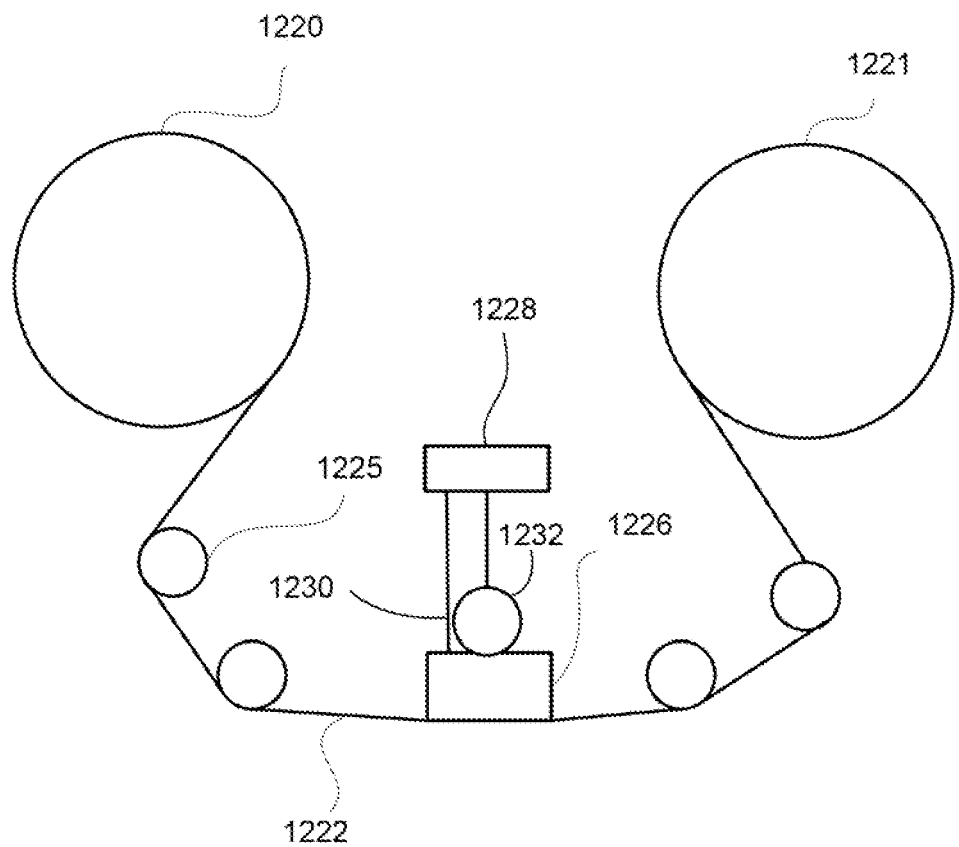
FIG. 15 is a schematic diagram of a tape drive system.

FIG. 15 illustrates a simplified tape drive 1200 which may be employed in the context of the present invention. While one specific implementation of a tape drive 1200 is shown in FIG. 15, it should be noted that the embodiments of the previous figures may be implemented in the context of any type of tape drive system.

As shown, a tape supply cartridge 1220 and a take-up reel 1221 are provided to support a tape 1222. These may form part of a removable cassette and are not necessarily pan of the system. Guides 1225 guide the tape 1222 across a preferably bidirectional tape head 1226, of the type disclosed herein. An actuator 1232 controls position of the head 1226 relative to the tape 1222. The tape head 1226 is in turn coupled to a controller assembly 1228 via an MR connector cable 1230. The controller 1228, in turn, controls head functions such as servo following, write bursts, read functions, etc. The controller 1228 runs under the control of computer instructions typically in firmware or software run locally or on a host system.

A tape drive, such as that illustrated in FIG. 15, includes drive motor(s) drive the tape supply cartridge 1220 and the take-up reel 1221 to move the tape 1222 linearly over the head 1226. The tape drive also includes a read/write channel to transmit data to the head 1226 to be recorded on the tape 1222 and to receive data read by the head 1226 from the tape 1222. An interface is also provided for communication between the tape drive and a host (integral or external) to send and receive the data and for controlling the operation of the tape drive and communicating the status of the tape drive to the host, all as will be understood by those of skill in the art. Examples of a host system include a computer, server, handheld device, etc. in communication with the interface device.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A system, comprising:
   a first device on a first substrate;
   a second device on a second substrate, the second substrate being positioned relative to the first substrate to allow transduction of data by the first and second devices to and/or from data tracks on a same side of a recording medium, wherein longitudinal axes of each of the data tracks are oriented in a direction extending along a length of the medium in a direction of travel of the medium across the devices;
   a device select system comprising:
      a first portion having an array of first electrical contacts;
      a second portion having an array of second electrical contacts, there being more second electrical contacts than first electrical contacts, the second portion being electrically coupled to the first and second devices, each of the first electrical contacts being associated with at least two of the second electrical contacts; and
      a select mechanism configured to selectively place each of the first electrical contacts in electrical communication with one of the second electrical contacts associated therewith, the select mechanism being coupled to the first and second devices such that the select mechanism moves with the first and second devices relative to the direction of travel of the recording medium thereacross.

2. A system as recited in claim 1, wherein the first and second electrical contacts and select mechanism are formed in a common structure.

3. A system as recited in claim 1, wherein the select mechanism includes an array of switches, the array being for selectively placing each of the first electrical contacts in electrical communication with one of the second electrical contacts associated therewith.

4. A system as recited in claim 1, further comprising at least one third electrical contact being in electrical communication with the select mechanism for passing control signals thereto.

5. A system as recited in claim 1, wherein the first and second devices are magnetic transducers coupled to the second electrical contacts, the select mechanism selectively placing the first electrical contacts in electrical communication with the first and/or second device, and further comprising an actuator for controlling a position of the first and second devices and select mechanism relative to the recording medium.

6. A system as recited in claim 5, wherein the first and second substrates together form at least a portion of a magnetic tape head having tape bearing surfaces with planar portions configured to directly engage a magnaic recording tape.

7. A system as recited in claim 6, wherein the planar portions of each tape bearing surface are positioned on opposite sides of each of the magnetic transducers in the direction of travel of the recording medium thereacross, wherein the planar portions of each tape bearing surface lie along a respective common plane.

8. A system as recited in claim 1, further comprising an array of first devices and an array of second devices, the arrays of devices being coupled to the second electrical contacts, the select mechanism selectively placing the first electrical contacts in electrical communication with the array of first devices or the array of second devices.

9. A system as recited in claim 1, wherein the first and second substrates are coupled together and move together along the same side of the recording medium in a cross-track direction.

10. A system as recited in claim 1, wherein media-facing surfaces of the first and second substrates are spaced apart, an air gap being defined therebetween.

11. A system as recited in claim 1, wherein the first and second portions of the device select system are coupled to the first and second devices such that the first and second portions also move with the first and second devices relative to the direction of travel of the recording medium thereacross.

12. A system, comprising:
    a first array of devices on a first substrate;
    a second array of devices on the first substrate;
    an actuator for moving the first and second array in a cross-track direction during operation of the first and second arrays, the cross track direction being perpendicular to longitudinal axes of data tracks on a magnetic medium passing the arrays of devices;
    a device select system coupled to the first and second arrays of devices, the device select system comprising:
       a first portion having an array of first electrical contacts;
       a second portion having an array of second electrical contacts, there being more second electrical contacts than first electrical contacts, the second portion being coupled to the first and second arrays of devices, each of the first electrical contacts being associated with at least two of the second electrical contacts; and
       a select mechanism for selectively placing each of the first electrical contacts in electrical communication with one of the second electrical contacts associated therewith, the select mechanism being coupled to the first and second devices such that the select mechanism moves with the first and second devices when the actuator moves the first and second devices.

13. A system as recited in claim 12, wherein the first and second devices are magnetic transducers coupled to the second electrical contacts, the select mechanism selectively placing the first electrical contacts in electrical communication with the first and/or second device, and further comprising an actuator for controlling a position of the first and second devices and select mechanism relative to the magnetic medium.

14. A system as recited in claim 12, wherein planar portions of each tape bearing surface are positioned on opposite sides of each of the devices in a direction of travel of the magnetic medium thereacross, wherein the planar portions of each tape bearing surface lie along a respective common plane.

15. A system as recited in claim 12, wherein the first and second portions of the device select system are coupled to the first and second devices such that the first and second portions also move with the first and second devices relative to a direction of travel of the magnetic medium thereacross.

* * * * *